United States Patent
Ishiwata

(10) Patent No.: US 7,423,500 B2
(45) Date of Patent: Sep. 9, 2008

(54) LOW-PASS FILTER CAPABLE OF PREVENTING UNNECESSARY ELECTROMAGNETIC COUPLING

(75) Inventor: Hiroyuki Ishiwata, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 225 days.

(21) Appl. No.: 11/521,756

(22) Filed: Sep. 15, 2006

(65) Prior Publication Data

US 2007/0103256 A1    May 10, 2007

(30) Foreign Application Priority Data

Nov. 4, 2005    (JP)    ............... 2005-321074

(51) Int. Cl.
*H03H 7/00* (2006.01)
(52) U.S. Cl. ........................ 333/172; 333/185
(58) Field of Classification Search ................ 333/12, 333/132, 172, 181–185
See application file for complete search history.

(56) References Cited

U.S. PATENT DOCUMENTS

| 5,499,000 | A  |   | 3/1996  | Morikawa et al. |        |
|-----------|----|---|---------|------------------|--------|
| 6,483,400 | B1 | * | 11/2002 | Phillips, Jr.    | 333/185 |
| 7,091,800 | B2 | * | 8/2006  | Yamamoto et al.  | 333/185 |
| 2005/0012567 | A1 | * | 1/2005 | Liu             | 333/185 |
| 2005/0219011 | A1 | * | 10/2005 | Lin et al.     | 333/185 |
| 2005/0231304 | A1 | * | 10/2005 | White et al.   | 333/185 |
| 2006/0038635 | A1 | * | 2/2006  | Richiuso et al.| 333/177 |

* cited by examiner

*Primary Examiner*—Don P Le
(74) *Attorney, Agent, or Firm*—Beyer Law Group LLP

(57) ABSTRACT

A plurality of conductive patterns constituting first, second, and third inductors are formed in a multi-layer wiring board. A fifth dielectric layer is disposed between second to fourth dielectric layers having the first inductor and a seventh dielectric layer having the second inductor. First and second electrode layers are disposed facing each other across the fifth dielectric layer so as to constitute a capacitor. The capacitor is disposed between the first and third inductors and the second inductor. The first electrode layer, i.e., one electrode of the capacitor, is a ground layer.

4 Claims, 4 Drawing Sheets

TRAP FREQUENCY

US 7,423,500 B2

LOW-PASS FILTER CAPABLE OF PREVENTING UNNECESSARY ELECTROMAGNETIC COUPLING

BACKGROUND OF THE INVENTION

1. Field of the Invention

The present invention relates to electronic devices having inductors and capacitors disposed in multi-layer wiring boards. In particular, the present invention relates to a low-pass filter with a trap at high frequencies.

2. Description of the Related Art

Low-pass filters can be employed to eliminate unnecessary frequency components generated at frequencies higher than a target frequency band. For example, when a transmitting circuit of a mobile phone transmits a signal from an antenna after performing power amplification on the signal by a power amplifier, unnecessary frequency components are generated at frequencies twice that of and three times greater than a desired frequency used for the signal transmission. As shown in FIG. 4, a low-pass filter having a stop band set at frequencies higher than the desired frequency can efficiently eliminate the unnecessary frequency components by having a trap at frequencies corresponding to the unnecessary frequency components.

FIG. 5 shows an example of a configuration of an LC low-pass filter with a trap. The LC low-pass filter shown in FIG. 5 is a T-section filter. More specifically, the LC low-pass filter has inductors L1 and L2 serially connected to a signal line between an input terminal $V_{IN}$ and an output terminal $V_{OUT}$ and a capacitor C connecting the connecting point of the inductors L1 and L2 and a ground. An inductor L3 is connected between the connecting point of the inductors L1 and L2 and the capacitor C so as to constitute an LC series resonant circuit between the signal line and the ground. In such an LC low-pass filter, setting a resonant frequency of the LC series resonant circuit at a trap frequency allows the frequency component at the trap frequency to be attenuated as shown in FIG. 4.

A multi-layer wiring board has tended to include the above-described low-pass filter and other circuit elements therein due to miniaturization and integration of electronic devices having the above-described low-pass filter.

FIG. 6 is a conceptual diagram showing a cross-sectional view of a multi-layer wiring board constituting the above-described low-pass filter. The multi-layer wiring board includes a plurality of laminated dielectric layers (not shown). Each dielectric layer has conductive patterns or the like formed thereon. First to third conductive patterns 101 to 103 are formed on adjacent dielectric layers of the multi-layer wiring board. In addition, fourth to sixth conductive patterns 104 to 106 are formed next to the first to third conductive patterns 101 to 103, respectively, on the corresponding dielectric layers. The first to third conductive patterns 101 to 103 formed on the plurality of dielectric layers constitute an inductor L1. Likewise, the fourth to sixth conductive patterns 104 to 106 constitute an inductor L2. Seventh and eighth conductive patterns 107 and 108, which constitute an inductor L3, are formed on dielectric layers below those having the inductor L2 (i.e., the fourth to sixth conductive patterns 104 to 106). A via hole 110 conductively connects one end of the sixth conductive pattern 106 and a part of the seventh conductive pattern 107. In addition, an electrode layer 120, i.e., a ground, formed on the lowest dielectric layer of the multi-layer wiring board and an electrode 109 formed on a dielectric layer immediately above the lowest dielectric layer constitute a capacitor C. A via hole 111 conductively connects the electrode 109, i.e., one of the electrodes of the capacitor C, and the eighth conductive pattern 108.

As described above, the inductors L1, L2, and L3 and the capacitor C included in the multi-layer wiring board constitute a low-pass filter having frequency characteristics in which the frequency component at the trap frequency is attenuated as shown in FIG. 4.

SUMMARY OF THE INVENTION

However, in a multi-layer wiring board shown in FIG. 6, an inductor L2 serially connected to a signal line and an inductor L3 that serves as an inductor component of an LC series resonant circuit are adjacently disposed vertically. Thus, an electromagnetic coupling is generated between the inductor L2 and the inductor L3, which may change the inductance of the inductor L3. The inductance of the inductor L3 is an important element for determining the trap frequency. Accordingly, the change in the inductance causes a change in the trap frequency, which prevents the efficient elimination of the unnecessary frequency components.

Embodiments of the present invention are made in view of the above-described disadvantage. The embodiments of the present invention provide a low-pass filter capable of preventing the electromagnetic coupling between inductors and of implementing low-pass filter characteristics preventing the change in the desired trap frequency, even if the multi-layer wiring board constituting the low-pass filter has a first inductor and a second inductor disposed vertically.

According to an aspect of the present invention, a low-pass filter includes a multi-layer wiring board having a plurality of laminated wiring layers, a plurality of conductive patterns formed on at least one of the wiring layers and constituting at least a first inductor and a second inductor in the multi-layer wiring board, and first and second electrodes that are disposed facing each other across a wiring layer that is disposed between the wiring layer having the conductive pattern constituting the first inductor and the wiring layer having the conductive pattern constituting the second inductor, and that constitutes a capacitor together with the wiring layer between the first and second electrodes. The capacitor is disposed between the first inductor and the second inductor in the multi-layer wiring board.

According to this configuration, in the multi-layer wiring board, the first and second electrodes of the capacitor are disposed between the first and second inductors. Accordingly, electrode planes of the capacitor block magnetic flux, which can advantageously suppress the electromagnetic coupling between the first inductor and the second inductor.

Additionally, in the low-pass filter according to the aspect of the present invention, either the first electrode or the second electrode that constitutes one electrode of the capacitor may be a ground layer. In this configuration, one of the electrodes of the capacitor is a ground layer, which eliminates the necessity for providing another layer as the ground layer. Accordingly, the electromagnetic coupling between the inductors is prevented without increasing the number of layers.

Furthermore, in the low-pass filter according to the aspect of the present invention, the conductive pattern constituting the first inductor may be serially connected to a part of a signal line for outputting a high-frequency signal, which is input from an input terminal, from an output terminal. The second inductor and the capacitor may be serially connected between the signal line and a ground such that one electrode of the capacitor is connected to the ground side.

Moreover, in the low-pass filter according to the aspect of the present invention, the conductive pattern may constitute a third inductor. One end of the conductive pattern constituting the first inductor and one end of the conductive pattern constituting the third inductor may be connected such that the third inductor is serially connected to the signal line.

According to the aspect of the present invention, a low-pass filter is capable of preventing the electromagnetic coupling between inductors and of implementing low-pass filter characteristics preventing the change in the desired trap frequency, even if the multi-layer wiring board constituting the low-pass filter has a first inductor and a second inductor disposed vertically.

DESCRIPTION OF THE PREFERRED EMBODIMENTS

A low-pass filter according to an embodiment of the present invention will be described in detail below with reference to the accompanying drawings.

Figure 5:
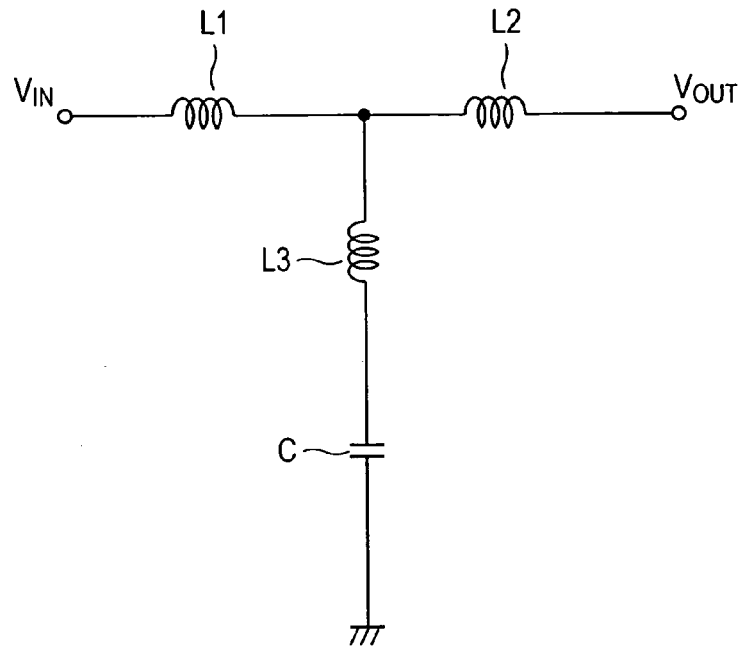
FIG. 5 is a circuit configuration diagram of a T-section low-pass filter.
Figure 6:
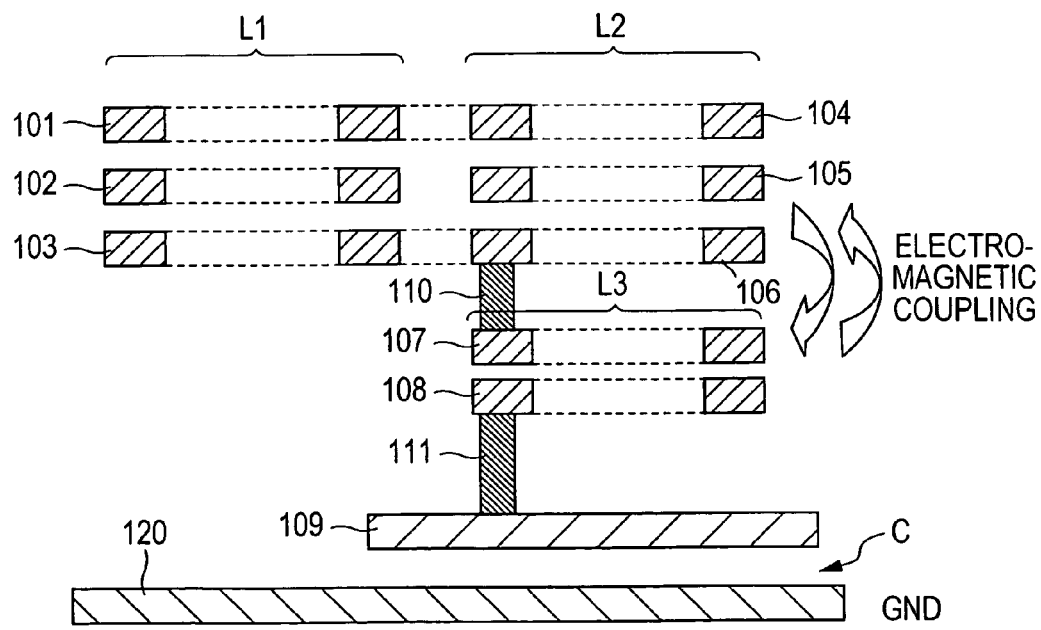
FIG. 6 is a conceptual diagram showing a cross-sectional structure of circuit elements of a low-pass filter shown in FIG. 5.

The description is given below under an assumption that the low-pass filter according to the embodiment has the same circuit configuration as that shown in FIG. 5. However, the present invention is not limited to this particular circuit configuration shown in FIG. 5.

Figure 1:
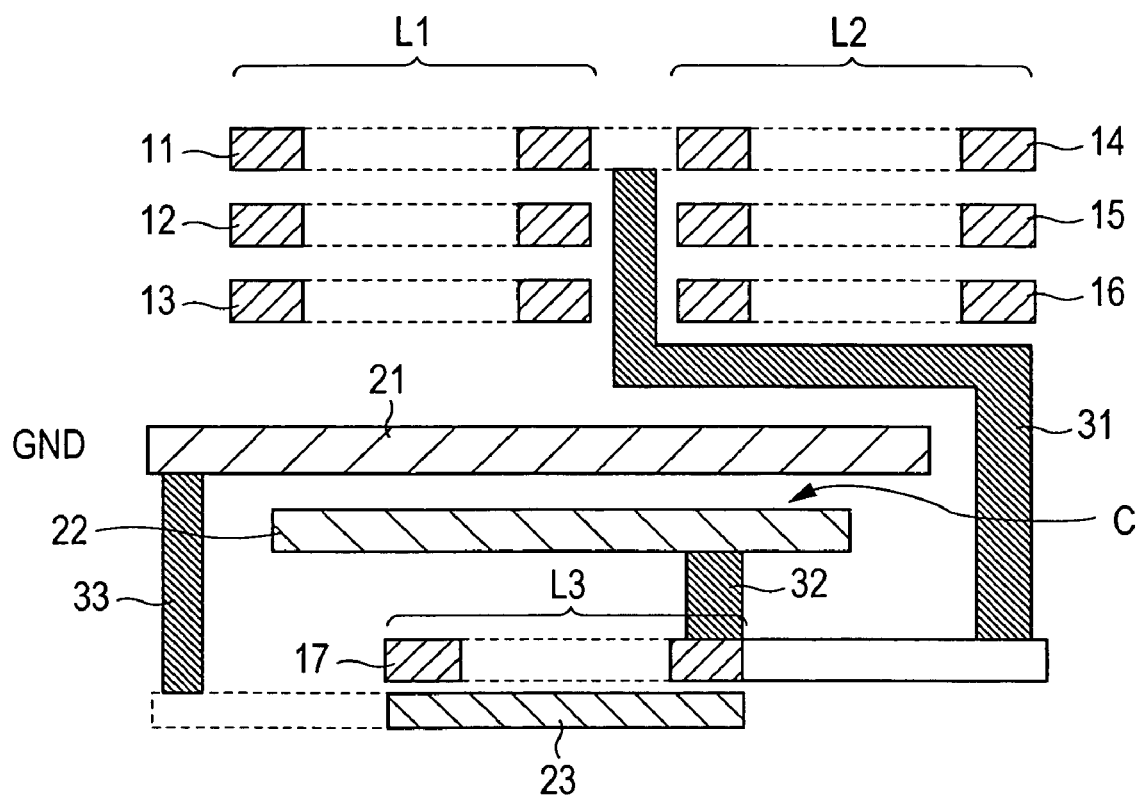
FIG. 1 is a conceptual diagram showing a cross-sectional structure of circuit elements of a low-pass filter according to an embodiment of the present invention.

FIG. 1 is a conceptual diagram showing a cross-sectional view of a multi-layer wiring board constituting a low-pass filter according to an embodiment of the present invention. More specifically, FIG. 1 mainly shows conductive patterns constituting inductors L1, L2, and L3 and electrode layers constituting a capacitor in a conceptual manner. According to the embodiment, a low temperature co-fired ceramic (LTCC) substrate includes the low-pass filter, which is composed of the multi-layer wiring board having a plurality of laminated dielectric layers.

As shown in FIG. 1, first to third conductive patterns 11 to 13 constituting the first inductor L1 are disposed facing each other in a laminate direction. Likewise, fourth to sixth conductive patterns 14 to 16 constituting the third inductor L2 are disposed facing each other in the laminate direction. Each pair of the first and fourth conductive patterns 11 and 14, the second and fifth conductive patterns 12 and 15, and the third and sixth conductive patterns 13 and 16 is formed on the same dielectric layer. A conductive pattern 17, which constitutes the second inductor L3, is formed on a dielectric layer lower than those having the inductors L1 and L2 formed thereon.

According to the embodiment, the inductors L1 and L2 are serially connected to a signal line between an input terminal $V_{IN}$ and an output terminal $V_{OUT}$. The inductor L3 serves as an inductor component of an LC series resonant circuit. A first electrode layer 21, i.e., a ground, and a second electrode layer 22 are disposed between the inductors L1 and L2 and the inductor L3 so as to face each other across a dielectric layer. The first electrode layer 21, the second electrode layer 22, and the dielectric layer (not shown) disposed therebetween constitute a capacitor C.

A via hole 31 is formed from a connecting point of the first conductive pattern 11 and the fourth conductive pattern 14, which are disposed on the same dielectric layer, to the seventh conductive pattern 17. The via hole 31 implements a circuit configuration in which the inductors L1 and L2 are conductively connected to the inductor L3. In addition, a via hole 32 conductively connects the second electrode layer 22 and the seventh conductive pattern 17. The via hole 32 implements a circuit configuration in which the other end of the inductor L3 is connected to one of the electrodes of the capacitor C.

The first electrode layer 21, i.e., the ground, is disposed between the inductors L1 and L2, and the inductor L3. A via hole 33 conductively connects the first electrode layer 21 and a third electrode layer 23, which is formed on the lowest layer of the multi-layer wiring board. Furthermore, although not shown in FIG. 1, the third electrode layer 23 is conductively connected to a ground terminal formed on the bottom face of the multi-layer wiring board. The input terminal $V_{IN}$ and the output terminal $V_{OUT}$ are also formed on the bottom face of the board. One end of the first conductive pattern 11 is conductively connected to the input terminal $V_{IN}$ through the via holes. Likewise, one end of the fourth conductive pattern 14 is conductively connected to the output terminal $V_{OUT}$ through the via holes. FIG. 1 shows the via holes 31 to 33 only for explaining the connection relationships. Thus, the positions of the via holes 31 to 33 do not show the disposition relationships accurately.

Figure 2:
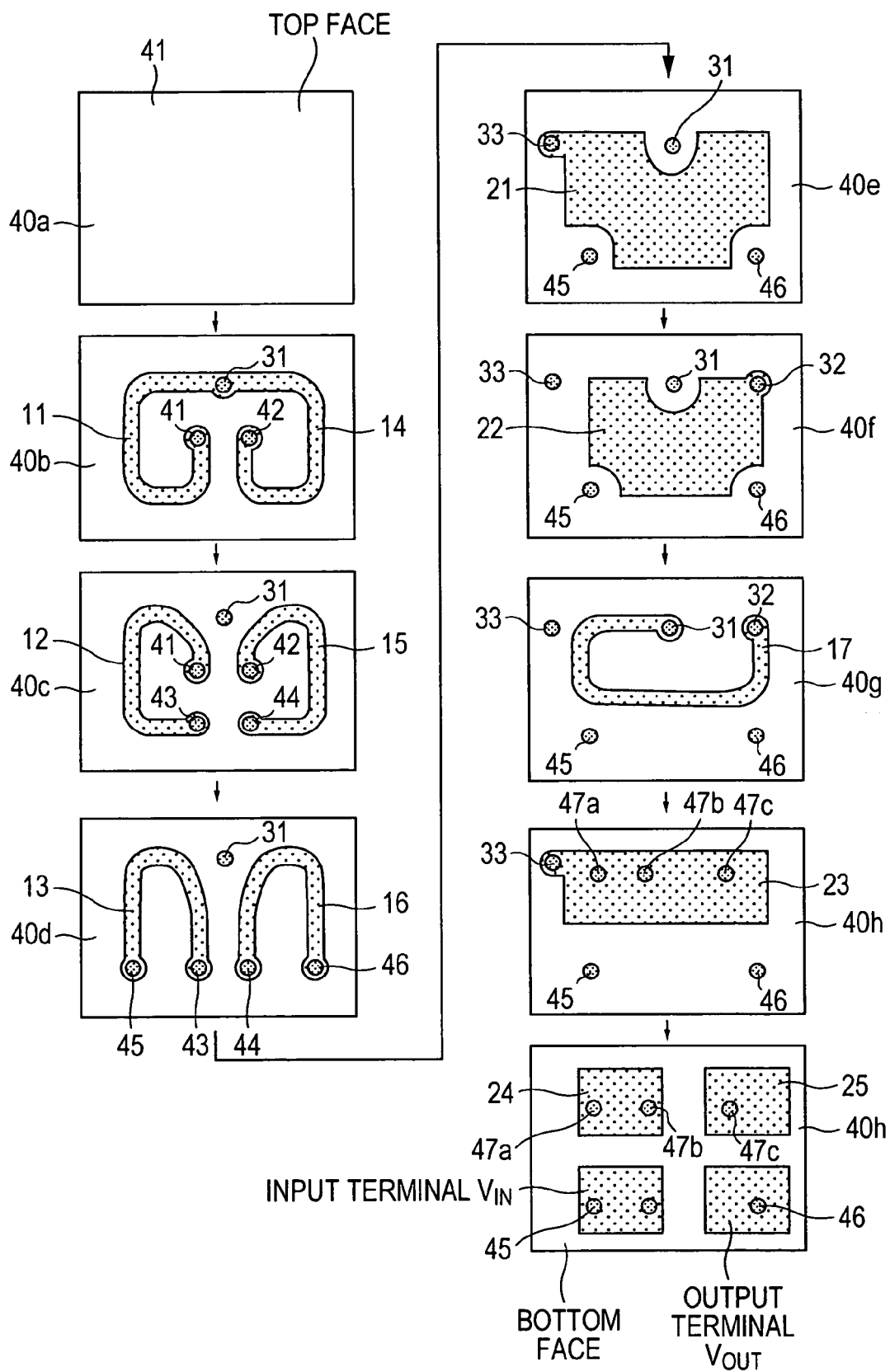
FIG. 2 is a plan view of each dielectric layer of a multi-layer wiring board constituting a low-pass filter according to an embodiment of the present invention.

FIG. 2 is a plan view of each dielectric layer that constitutes the multi-layer wiring board of the low-pass filter. The multi-layer wiring board according to the embodiment of the present invention is composed of first to eighth dielectric layers 40a to 40h from the top face to the bottom face thereof.

One face of the first dielectric layer 40a corresponds to the top face of the multi-layer wiring board, and serves as a land that allows various circuit elements to lie thereon. The top face of the second dielectric layer 40b has the first and fourth conductive patterns 11 and 14 formed thereon. The first conductive pattern 11 is formed in the left half of the top face of the second dielectric layer 40b. One end of the first conductive pattern 11 is conductively connected to one end of a via hole 41, which communicates with the third dielectric layer 40c. The fourth conductive pattern 14 is formed in the right half of the top face of the second dielectric layer 40b. One end of the fourth conductive pattern 14 is connected to one end of a via hole 42, which communicates with the third dielectric layer 40c. The other ends of the first and fourth conductive patterns 11 and 14 are connected to each other, and the connecting point thereof is conductively connected to one end of a via hole 31, which communicates with the seventh dielectric layer 40g.

The top face of the third dielectric layer 40c has the second and fifth conductive patterns 12 and 15 formed thereon. The second conductive pattern 12 is formed in the left half of the top face of the third dielectric layer 40c. One end of the second conductive pattern 12 is conductively connected to the first conductive pattern 11 through the via hole 41. The other end of the second conductive pattern 12 is conductively connected to one end of a via hole 43, which communicates with the fourth dielectric layer 40d. The fifth conductive pattern 15 is formed in the right half of the top face of the third dielectric layer 40c. One end of the fifth conductive pattern 15 is conductively connected to the fourth conductive pattern 14 through the via hole 42. The other end of the fifth conductive pattern 15 is conductively connected to one end of a via hole 44, which communicates with the fourth dielectric layer 40d.

The top face of the fourth dielectric layer 40d has the third and sixth conductive patterns 13 and 16 formed thereon. The third conductive pattern 13 is formed in the left half of the top face of the fourth dielectric layer 40d. One end of the third conductive pattern 13 is conductively connected to the second conductive pattern 12 through the via hole 43. The other end of the third conductive pattern 13 is conductively connected to the input terminal $V_{IN}$ formed on the bottom face of the multi-layer wiring board through a via hole 45, which communicates with the bottom face of the eighth dielectric layer 40h. The sixth conductive pattern 16 is formed in the right half of the top face of the fourth dielectric layer 40d. One end of the sixth conductive pattern 16 is conductively connected to the fifth conductive pattern 15 through the via hole 44. The other end of the sixth conductive pattern 16 is conductively connected to the output terminal $V_{OUT}$ formed on the bottom face of the multi-layer wiring board through a via hole 46, which communicates with the bottom face of the eighth dielectric layer 40h.

More specifically, the first to third conductive patterns 11 to 13 serially connected are formed in a coil shape from the second dielectric layer 40b to the fourth dielectric layer 40d. Likewise, the fourth to sixth conductive patterns 14 to 16 serially connected are formed in a coil shape from the second dielectric layer 40b to the fourth dielectric layer 40d. One end of the third conductive pattern 13, i.e., an input end of the inductor L1, is connected to the input terminal $V_{IN}$ formed on the bottom face of the multi-layer wiring board. One end of the sixth conductive pattern 16, i.e., an output end of the inductor L2, is connected to the output terminal $V_{OUT}$ formed on the bottom face of the multi-layer wiring board. The first and fourth conductive patterns 11 and 14, disposed on the dielectric layer 40b, are connected to each other. Accordingly, a high-frequency signal, after being received by the input terminal $V_{IN}$, propagates through the third, second, and first conductive patterns 13, 12, and 11. The high-frequency signal then propagates through the fourth, fifth, and sixth conductive pattern 14, 15, and 16, before being output from the output terminal $V_{OUT}$.

The top face of the fifth dielectric layer 40e has the first electrode layer 21, i.e., the ground, formed thereon. As described above, the first to third conductive patterns 11 to 13 are formed in the left half of the corresponding dielectric layer, whereas the fourth to sixth conductive patterns 14 to 16 are formed in the right half of the corresponding dielectric layer. The first electrode layer 21, i.e., the ground, is formed so as to cover both the left half and the right half of the top face of the fifth dielectric layer 40e. That is, the first electrode layer 21 has an area that covers the whole area below the inductors L1 and L2. As mentioned above, the first to third conductive patterns 11 to 13 constitute the inductor L1, whereas the fourth to sixth conductive patterns 14 to 16 constitute the inductor L2. The size and shape of the first electrode layer 21 are not limited to the particular size and shape shown in FIG. 2. The first electrode layer 21 may have any size and shape as long as it is capable of suppressing electromagnetic couplings between the inductors L1 and L3, and electromagnetic coupling between the inductors L2 and L3. For example, when the first electrode layer 21 at least covers an area equivalent to the conductive pattern 17 constituting the inductor L3, the first electrode layer 21 can advantageously suppress the electromagnetic couplings between the inductors L1 and L3, and the electromagnetic coupling between the inductors L2 and L3, even if the area does not cover the area of the inductors L1 and L2. In addition, a part of the first electrode layer 21 is conductively connected to one end of a via hole 33, which communicates with the eighth dielectric layer 40h.

The top face of the sixth dielectric layer 40f has the second electrode layer 22, which constitutes the capacitor C with the first electrode layer 21, i.e., the ground. More specifically, across the fifth dielectric layer 40e, the first electrode layer 21, i.e., one of the electrodes of the capacitor C, is formed on one side, whereas the second electrode layer 22, i.e., the other electrode of the capacitor C, is formed on the other side. A part of the second electrode layer 22 is conductively connected to one end of a via hole 32, which communicates with the seventh dielectric layer 40g.

The top face of the seventh dielectric layer 40g has the seventh conductive pattern 17 formed thereon. One end of the seventh conductive pattern 17 is connected to the connecting point of the first and fourth conductive patterns 11 and 14 through the via hole 31, which communicates with the second dielectric layer 40b. In addition, the other end of the seventh conductive pattern 17 is connected to the second electrode layer 22 formed on the sixth dielectric layer 40f through the via hole 32.

The top face of the eighth dielectric layer 40h has the third electrode layer 23 formed thereon. The bottom face of the eighth dielectric layer 40h, i.e., the bottom face of the multi-layer wiring board, has the input terminal $V_{IN}$, the output terminal $V_{OUT}$, a first ground terminal 24, and a second ground terminal 25 formed thereon. The third electrode layer 23 and the first and second ground terminals 24 and 25 are connected to each other through via holes 47a to 47c.

The embodiment of the present invention adopts Ag films to form the first to sixth conductive patterns 11 to 16. However, other conductive materials are also adoptable.

The multi-layer wiring board, constituting the low-pass filter, having the above-described configuration has the inductor L1 (i.e., the conductive patterns 11 to 13) and the inductor L2 (i.e., the conductive patterns 14 to 16) disposed side-by-side on the second to fourth dielectric layers 40b to 40d. In addition, the seventh dielectric layer 40g is disposed below the second to fourth dielectric layers 40b to 40d (i.e., on the side near the bottom face of the multi-layer wiring board). The top face of the seventh dielectric layer 40g has the inductor L3 (i.e., the conductive pattern 17) thereon. The inductor L3 is the inductor component of the LC series resonant circuit that attenuates frequency components at a trap frequency, so that the low-pass filter has the frequency characteristics in which the frequency components are attenuated at the trap frequency.

On the other hand, the first electrode layer 21, which serves as one of the electrodes of the capacitor C, is connected to the ground terminals 24 and 25 through the via hole 33, the third electrode layer 23, and the via holes 47a to 47c. Accordingly, the first electric layer 21, which is disposed between the first to sixth conductive patterns 11 to 16 and the seventh conductive pattern 17, has the same potential as the ground.

When the input terminal $V_{IN}$ disposed on the bottom face of the multi-layer wiring board receives the high-frequency signal, the signal propagates through the first to third conductive patterns 11 to 13 (i.e., the inductor L1) and the fourth to sixth conductive patterns 14 to 16 (i.e., the inductor L2). At this time, part of the magnetic flux generated by the inductor L1 composed of the first to third conductive patterns 11 to 13 goes to the inductor L3 composed of the seventh conductive pattern 17. Likewise, part of the magnetic flux generated by the inductor L2 composed of the fourth to sixth conductive patterns 14 to 16 goes to the inductor L3. The seventh conductive pattern 17 outputs the high-frequency signal, received at the via hole 31 (i.e., one end), from the via hole 32 (i.e., the other end). At this time, part of magnetic flux generated by the inductor L3 (i.e., the seventh conductive pattern 17) goes upward where the inductors L1 and L2 are disposed.

According to the embodiment of the present invention, the inductors L1 and L2, and the inductor L3 are disposed vertically. The first electrode layer 21 (i.e., the ground) having the same potential as the ground is disposed between the inductors L1 and L2, and the inductor L3. Thus, even if the magnetic flux from the inductors L1 and L2 to the inductor L3 or from the inductor L3 to the inductors L1 and L2 is generated, the first electrode layer 21 blocks the magnetic flux. This can advantageously prevent the electromagnetic couplings between the inductors L1 and L3, and the electromagnetic coupling between the inductors L2 and L3.

As described above, the embodiment of the present invention can prevent the electromagnetic coupling between the inductors L1 and L3, and the electromagnetic coupling between the inductors L2 and L3. The inductors L1 and L2 implement attenuation characteristics at a high-frequency band of the low-pass filter. The inductor L3 serves as the inductor component for attenuating frequency components at a desired frequency (i.e., the trap frequency). Accordingly, the embodiment of the present invention can implement the low-pass filter having the frequency characteristics in which frequency components are attenuated at the desired frequency (i.e., the trap frequency).

In addition, according to the embodiment of the present invention, the first electrode layer (i.e., the ground layer) serving as one of the electrodes of the capacitor C is disposed between the inductors that potentially generate electromagnetic coupling to be prevented. Thus, the embodiment of the present invention can implement desired filter characteristics without increasing the number of layers of the multi-layer wiring board since the necessity for providing another layer for preventing the electromagnetic coupling between the inductors is eliminated.

The description given above employs the low-pass filter having the two inductors L1 and L2 connected to the signal line between the input terminal $V_{IN}$ and the output terminal $V_{OUT}$ and the capacitor C connected between the connecting point of the inductors L1 and L2 and the ground as an example. However, the present invention is applicable to low-pass filters having other circuit configurations.

Figure 3:
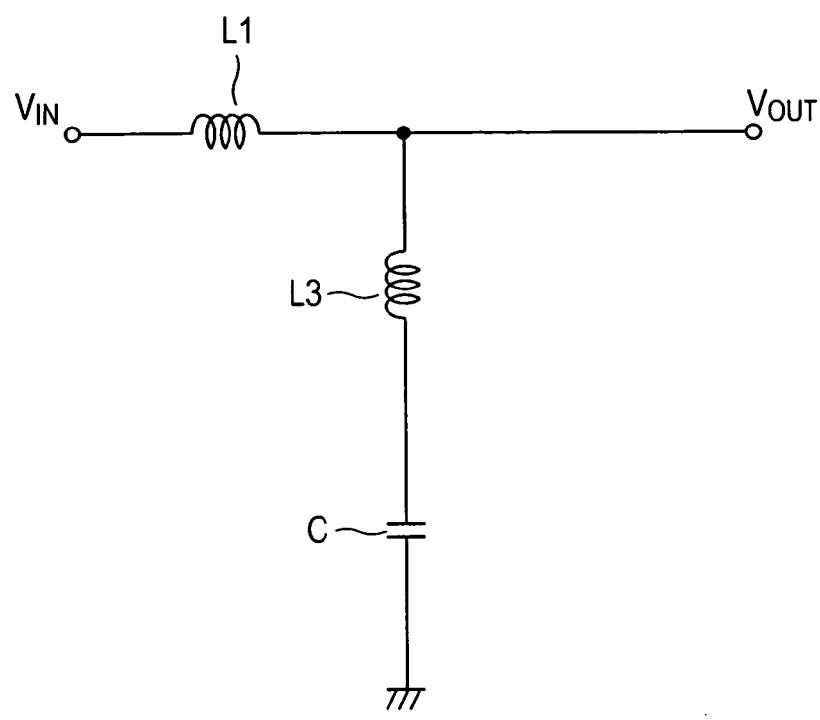
FIG. 3 is a circuit configuration diagram of an LC low-pass filter.
Figure 4:
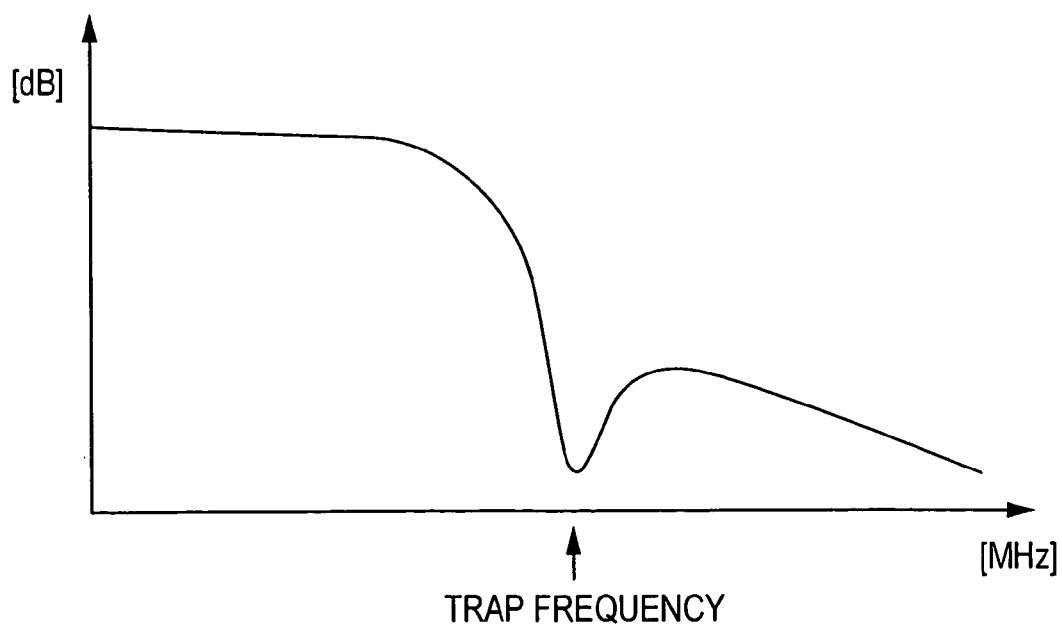
FIG. 4 is a diagram showing frequency characteristics of a low-pass filter with a trap.

For example, as shown in FIG. 3, a low-pass filter may have an inductor L1 serially connected to a signal line between an input terminal $V_{IN}$ and an output terminal $V_{OUT}$ and a capacitor C connected between an output end of the inductor L1 and a ground. An inductor L3 may be connected between the output end of the inductor L1 and the capacitor C so as to constitute an LC series resonant circuit.

In a multi-layer wiring board constituting such a low-pass filter, electrode layers constituting the capacitor C are disposed between conductive patterns constituting the inductor L1 and conductive patterns constituting the inductor L3. Since one of the electrodes of the capacitor C is maintained at a ground potential level, it is desirable that the ground electrode layer is assigned as the ground-side electrode of the capacitor C. Accordingly, disposition of the electrode layers constituting the capacitor C between the conductive patterns constituting the inductor L1 and the conductive patterns constituting the inductor L3 prevents electromagnetic coupling between the inductors L1 and L3.

The present invention is applicable to low-pass filters that have frequency characteristics in which frequency components are attenuated at a high-frequency band and at a trap frequency.

What is claimed is:

1. A low-pass filter capable of preventing an unnecessary electromagnetic coupling, the low-pass filter comprising:
    a multi-layer wiring board having a plurality of laminated wiring layers;
    a plurality of conductive patterns formed on at least one of the wiring layers and constituting at least a first inductor and a second inductor in the multi-layer wiring board; and
    first and second electrodes that are disposed facing each other across a wiring layer that is disposed between the wiring layer having the conductive pattern constituting the first inductor and the wiring layer having the conductive pattern constituting the second inductor, and that constitutes a capacitor together with the wiring layer between the first and second electrodes, characterized in that
    the capacitor is disposed between the first inductor and the second inductor in the multi-layer wiring board.

2. The low-pass filter capable of preventing the unnecessary electromagnetic coupling according to claim 1, characterized in that either the first electrode or the second electrode that constitutes one electrode of the capacitor is a ground layer.

3. The low-pass filter capable of preventing the unnecessary electromagnetic coupling according to claim 1, characterized in that the conductive pattern constituting the first inductor is serially connected to a part of a signal line for outputting a high-frequency signal, which is input from an input terminal, from an output terminal, and wherein the second inductor and the capacitor are serially connected between the signal line and a ground such that one electrode of the capacitor is connected to the ground side.

4. The low-pass filter capable of preventing the unnecessary electromagnetic coupling according to claim 1, characterized in that the conductive pattern constitutes a third inductor, and wherein one end of the conductive pattern constituting the first inductor and one end of the conductive pattern constituting the third inductor are connected such that the third inductor is serially connected to the signal line.

* * * * *